United States Patent
Omae et al.

(10) Patent No.: US 12,069,813 B2
(45) Date of Patent: Aug. 20, 2024

(54) ELECTRONIC DEVICE AND ELECTRIC POWER STEERING APPARATUS HAVING ELECTRONIC DEVICE MOUNTED THERETO

(71) Applicant: Mitsubishi Electric Corporation, Tokyo (JP)

(72) Inventors: Katsuhiko Omae, Tokyo (JP); Takashi Nagao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 806 days.

(21) Appl. No.: 17/048,856

(22) PCT Filed: May 14, 2018

(86) PCT No.: PCT/JP2018/018485
§ 371 (c)(1),
(2) Date: Oct. 19, 2020

(87) PCT Pub. No.: WO2019/220482
PCT Pub. Date: Nov. 21, 2019

(65) Prior Publication Data
US 2021/0168950 A1 Jun. 3, 2021

(51) Int. Cl.
*H05K 5/00* (2006.01)
*B62D 5/04* (2006.01)
(Continued)

(52) U.S. Cl.
CPC ......... *H05K 5/0069* (2013.01); *B62D 5/0403* (2013.01); *H01R 12/724* (2013.01);
(Continued)

(58) Field of Classification Search
CPC ....... H05K 5/0069; H05K 2201/09354; H05K 2201/1006; H05K 1/0215; H05K 2201/09754
See application file for complete search history.

(56) References Cited

U.S. PATENT DOCUMENTS 5,443,550 A * 8/1995 Yoneda .................. F02M 69/48
333/167
9,433,083 B2 * 8/2016 Moncayo ............... H05K 1/025
(Continued)

FOREIGN PATENT DOCUMENTS

JP 06-077681 A 3/1994
JP 2000-286587 A 10/2000
(Continued)

OTHER PUBLICATIONS

Office Action dated Mar. 1, 2022 from the Japanese Patent Office in JP Application No. 2020-519214.
(Continued)

*Primary Examiner* — Sherman Ng
(74) *Attorney, Agent, or Firm* — Sughrue Mion, PLLC; Richard C. Turner

(57) ABSTRACT

The electronic device includes: a substrate having an electronic circuit formed therein; a housing for housing the substrate; and a connector disposed on the substrate and serving as an interface between outside and inside of the housing. The substrate has a main circuit pattern portion that forms a main circuit and a frame ground pattern portion that forms a frame ground. The main circuit pattern portion and the frame ground pattern portion are disposed so as not to overlap each other on the substrate and in the substrate. A terminal of the connector is disposed in the frame ground pattern portion.

23 Claims, 8 Drawing Sheets

(51) Int. Cl.
  *H01R 12/72* (2011.01)
  *H05K 1/18* (2006.01)
  *H05K 5/02* (2006.01)
  *H05K 5/04* (2006.01)
  *H05K 9/00* (2006.01)

(52) U.S. Cl.
  CPC ........... *H05K 1/181* (2013.01); *H05K 5/0247* (2013.01); *H05K 5/04* (2013.01); *H05K 9/0007* (2013.01); *H05K 2201/1006* (2013.01)

(56) References Cited

U.S. PATENT DOCUMENTS

| | | | |
|---|---|---|---|
| 2008/0117609 A1 | 5/2008 | Itou et al. | |
| 2009/0068860 A1* | 3/2009 | Suzuki | H01R 12/88 439/67 |
| 2012/0057318 A1* | 3/2012 | Oota | H05K 7/20854 361/753 |
| 2012/0314385 A1* | 12/2012 | Mishima | H05K 9/0032 361/752 |
| 2014/0315438 A1* | 10/2014 | Fukami | H01R 13/6594 439/626 |
| 2015/0189734 A1* | 7/2015 | Nishimoto | H05K 3/3415 361/720 |
| 2015/0334822 A1 | 11/2015 | Shinkawa et al. | |
| 2016/0036288 A1* | 2/2016 | Yamasaki | B62D 5/0463 310/52 |
| 2017/0347454 A1* | 11/2017 | Harashima | H05K 1/0295 |
| 2018/0138615 A1* | 5/2018 | Matsumoto | H05K 3/301 |

FOREIGN PATENT DOCUMENTS

| | | |
|---|---|---|
| JP | 50344543 B2 | 9/2012 |
| JP | 6123848 B2 | 5/2017 |
| WO | 2014/112336 A1 | 7/2014 |

OTHER PUBLICATIONS

Communication dated Mar. 28, 2023, issued in Japanese Application No. 2020-519214.
Extended European Search Report dated Apr. 26, 2021 from the European Patent Office in EP Application No. 18918651.3.
International Search Report for PCT/JP2018/018485 dated Jul. 31, 2018 [PCT/ISA/210].
Written Opinion for PCT/JP2018/018485 dated Jul. 31, 2018 [PCT/ISA/237].
Communication dated Aug. 17, 2021 from the Japanese Patent Office in Application No. 2020-519214.
European Office Action issued Oct. 2, 2023 in Application No. 18 918 651.3.
Chinese Office Action dated Nov. 30, 2023 in Application No. 201880093235.6.
Office Action issued Mar. 28, 2024 in Chinese Application No. 201880093235.6.
Chinese Office Action issued on Jun. 25, 2024, corresponding to Patent Application No. 201880093235.6.

* cited by examiner

PORTION B IS ENLARGED

ELECTRONIC DEVICE AND ELECTRIC POWER STEERING APPARATUS HAVING ELECTRONIC DEVICE MOUNTED THERETO

CROSS REFERENCE TO RELATED APPLICATIONS

This application is a National Stage of International Application No. PCT/JP2018/018485 filed May 14, 2018.

TECHNICAL FIELD

The present disclosure relates to an electronic device having an electronic circuit substrate and an electric power steering apparatus.

BACKGROUND ART

In a conventional electronic device, a substrate ground, a connector ground line, and a frame ground (controller holding member) are electrically connected directly to each other, to reduce a common mode noise and reduce leakage of the common mode noise to outside (for example, see Patent Document 1). In general, a housing of the electronic device (electric power steering apparatus in Patent Document 1) is electrically connected to a body of a vehicle in many cases. In these cases, power supply current supplied from a battery of an automobile is returned through the body to the battery. In a case where a connector has a ground harness returning to a battery ground, return current is divided so as to flow in the body and the harness, and the ratio in the division is determined by their wiring resistances.

In another conventional electronic device, a shield pattern is disposed in an inner layer of a substrate in order to inhibit noise flowing into an electronic component (first electronic component) to which a connector directly connects and which is mounted on a surface or a back face of a multilayer substrate from being transmitted to a built-in electronic component (for example, see Patent Document 2). In this case, the shield pattern is connected to a ground layer, thereby enhancing a shielding effect.

CITATION LIST

Patent Document

Patent Document 1: Japanese Patent No. 6123848
Patent Document 2: Japanese Patent No. 5034453

SUMMARY OF THE INVENTION

Problems to be Solved by the Invention

However, in the configuration disclosed in Patent Document 1, there is an inconvenience that, if a current division ratio is not determined, wiring cannot be designed. Therefore, the wiring resistance needs to be designed to have a predetermined value, that is, the current division ratio needs to be designed to have a fixed value.

Particularly, for example, using, as a bolt for fixing members, a specific bolt for assuring electric connection separately from mechanical fixing needs to be considered for designing a configuration of a body system, thereby increasing cost. The same applies to a case where current is returned to the body only.

Total current can be designed to be returned to a harness ground without dividing the flow of the current. However, in this case, an insulating process needs to be performed to electrically insulate the electronic device from the body. Therefore, cost is increased as in the above-described case.

Furthermore, in the configuration disclosed in Patent Document 2, a ground layer of the substrate may not necessarily provide a ground that is stable with respect to a common mode noise. Particularly in an inverter circuit in which switching of large current is performed, the ground layer may become a noise source. In this case, use of the ground layer for the shield pattern may cause a problem that a path for transmitting a noise to an electronic component (second electronic component) mounted in the multilayer substrate is generated, and, further, noise is transmitted to outside of the device through the first electronic component and the connector.

The present disclosure has been made in view of the aforementioned problems, and an object of the present disclosure is to provide an electronic device capable of effectively reducing a common mode noise which leaks from the electronic device and effectively preventing a noise from coming from outside, at low cost.

Solution to the Problems

An electronic device according to the present disclosure includes:
a substrate having an electronic circuit formed therein;
a housing for housing the substrate; and
a connector disposed on the substrate and serving as an interface between outside and inside of the housing, in which
the substrate has a main circuit pattern portion that forms a main circuit and a frame ground pattern portion that forms a frame ground,
the main circuit pattern portion and the frame ground pattern portion are disposed so as not to overlap each other on the substrate and in the substrate, and
a terminal of the connector is disposed in the frame ground pattern portion.

Effect of the Invention

In the electronic device according to the present disclosure, electrostatic coupling between the main circuit pattern portion and the frame ground pattern portion is made sparse, thereby reducing leakage of a common mode noise generated in the main circuit to outside through the electrostatic coupling.

BRIEF DESCRIPTION OF THE DRAWINGS

FIG. 1A is a plan view thereof and FIG. 1B is an A-A' cross-sectional view of the electronic device shown in FIG. 1A.

FIG. 2A is a plan view thereof and FIG. 2B is an A-A' cross-sectional view of the electronic device shown in FIG. 2A.

FIG. 3A is a circuit block diagram illustrating electrostatic coupling in a dense state, FIG. 3B illustrates a noise transmission route in the circuit block diagram shown in FIG. 3A, and FIG. 3C illustrates a noise transmission route in the circuit block diagram illustrating electrostatic coupling in a sparse state.

FIG. 4A is a plan view thereof, FIG. 4B is an A-A' cross-sectional view of the electronic device shown in FIG. 4A, and FIG. 4C is an enlarged cross-sectional view of a portion B indicated by a broken line in FIG. 4B.

FIG. 5A is a plan view thereof and FIG. 5B is an A-A' cross-sectional view of the electronic device shown in FIG. 5A.

FIG. 6A is a plan view thereof and FIG. 6B is an A-A' cross-sectional view of the electronic device shown in FIG. 6A.

DESCRIPTION OF EMBODIMENTS

Embodiment 1

Figure 1A:
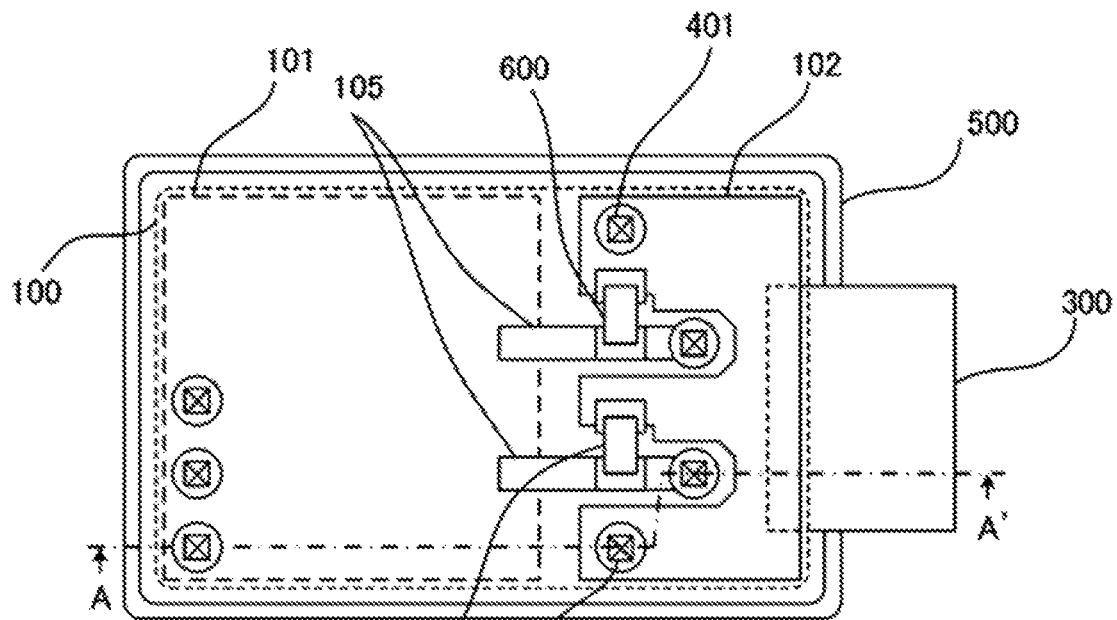
FIGS. 1A and 1B illustrate the entire configuration of an electronic device according to embodiment 1.
Figure 1B:
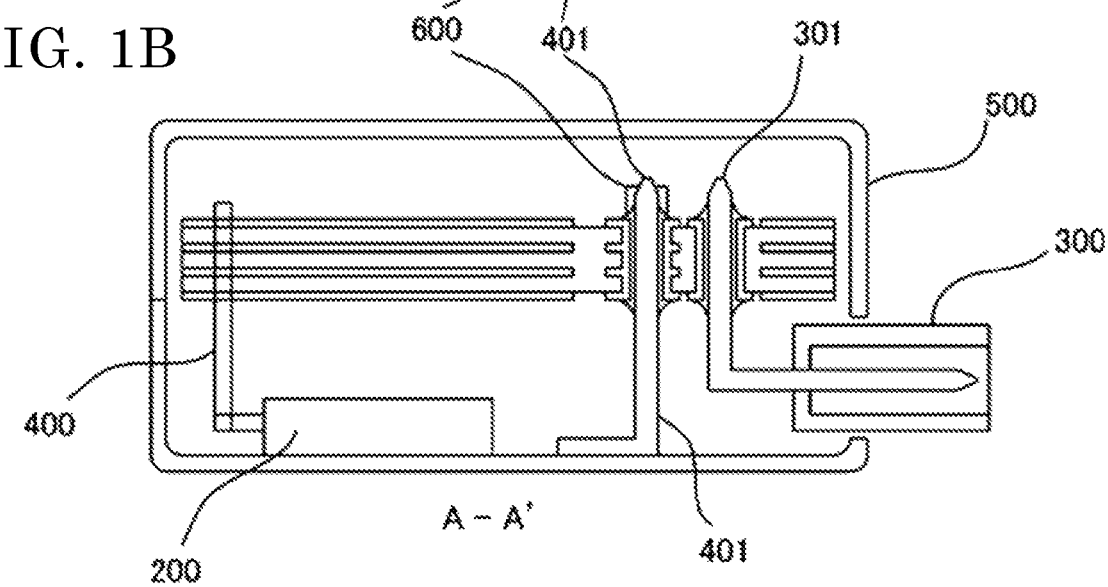

Embodiment 1 will be described below with reference to FIGS. 1A and 1B to FIGS. 4A and 4B. Hereinafter, throughout the drawings, the same or corresponding members and portions are denoted and described by using the same reference characters. FIGS. 1A and 1B illustrates the entire configuration of an electronic device according to embodiment 1, and FIG. 1A is a plan view of the electronic device and FIG. 1B is an A-A' cross-sectional view of the electronic device shown in FIG. 1A. The electronic device includes a substrate 100 in which an electronic circuit is configured, a module 200 disposed as appropriate, a connector 300 that serves as an interface to the outside, wiring 400 that electrically connects between the substrate 100 and the module 200, and a housing 500 that is made of metal and that houses these components.

The substrate 100 is divided into a main circuit pattern portion 101 that forms a main circuit and a frame ground pattern portion 102 that forms a frame ground. The main circuit pattern portion 101 and the frame ground pattern portion 102 are wired such that electrostatic coupling is sparse. The frame ground pattern portion 102 is connected to the housing 500 by a frame ground terminal 401 at a low impedance. A noise filter 600 is inserted in a line connected from the main circuit pattern portion 101 to the connector 300. Components of the noise filter 600 are disposed near a boundary between the main circuit pattern portion 101 and the frame ground pattern portion 102, or disposed on the frame ground pattern portion 102 side. Among the components of the noise filter 600, a ground is connected to the frame ground pattern portion 102, and a connector terminal 301 that connects between the connector 300 and the noise filter 600 is disposed on the frame ground pattern portion 102 side. Wiring 105 represents a pattern connected from the main circuit pattern portion 101 to the connector 300 (the wiring 105 is not shown in FIG. 1B).

As shown in the A-A' cross-sectional view in FIG. 1B, the main circuit pattern portion 101 and the frame ground pattern portion 102 are separated without overlapping each other, and the internal layer patterns thereof are also separated without overlapping each other. Therefore, the electrostatic coupling becomes sparse.

Figure 2A:
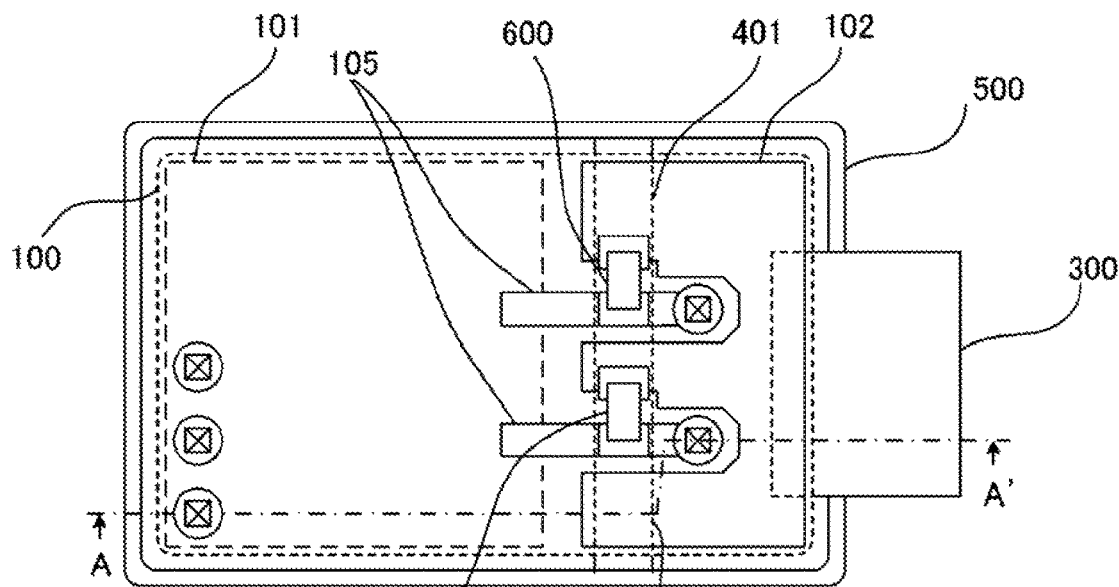
FIGS. 2A and 2B illustrate the entire configuration of another electronic device according to embodiment 1.
Figure 2B:
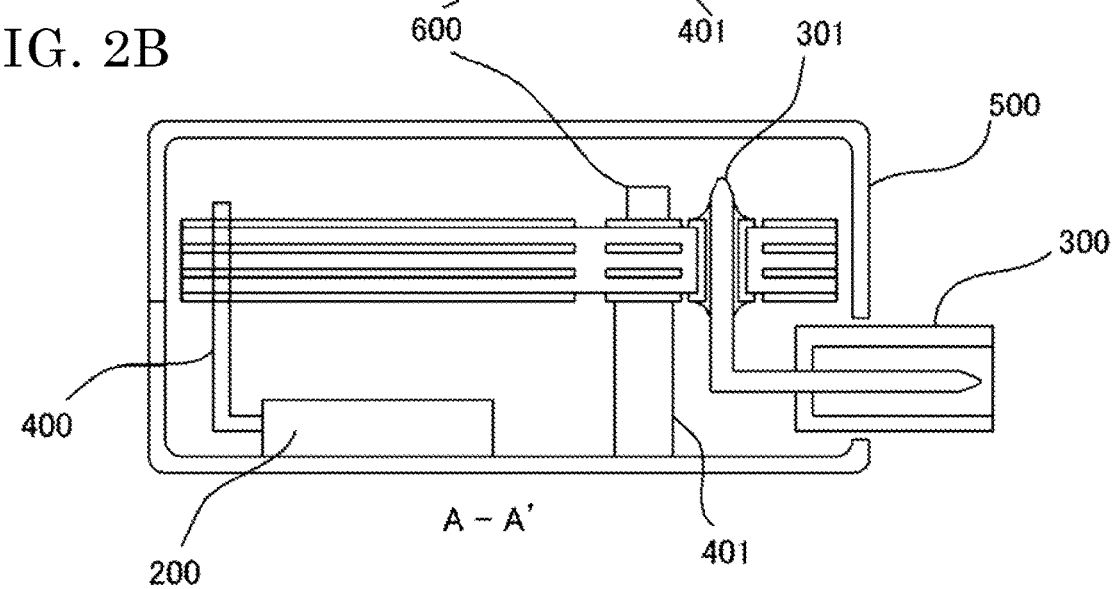

FIGS. 2A and 2B illustrates the entire configuration of another electronic device according to embodiment 1, and FIG. 2A is a plan view of the electronic device and FIG. 2B is an A-A' cross-sectional view of the electronic device shown in FIG. 2A. In the electronic device having such a configuration, the frame ground terminal 401 is configured such that a wall stands from the bottom surface of the housing 500 without soldering the terminal to the substrate as shown in FIG. 1B, and the frame ground terminal 401 contacts and electrically connects with the back face of the substrate at a wider area. In such a configuration, the housing 500 and the frame ground can be connected at a lower impedance as compared with the configuration in FIGS. 1A and 1B.

Next, the behavior of a common mode noise in the electronic device shown in FIGS. 1A and 1B or FIGS. 2A and 2B will be described for a case where electrostatic coupling between the main circuit pattern portion 101 and the frame ground pattern portion 102 is dense and for a case where electrostatic coupling therebetween is sparse.

Figure 3A:
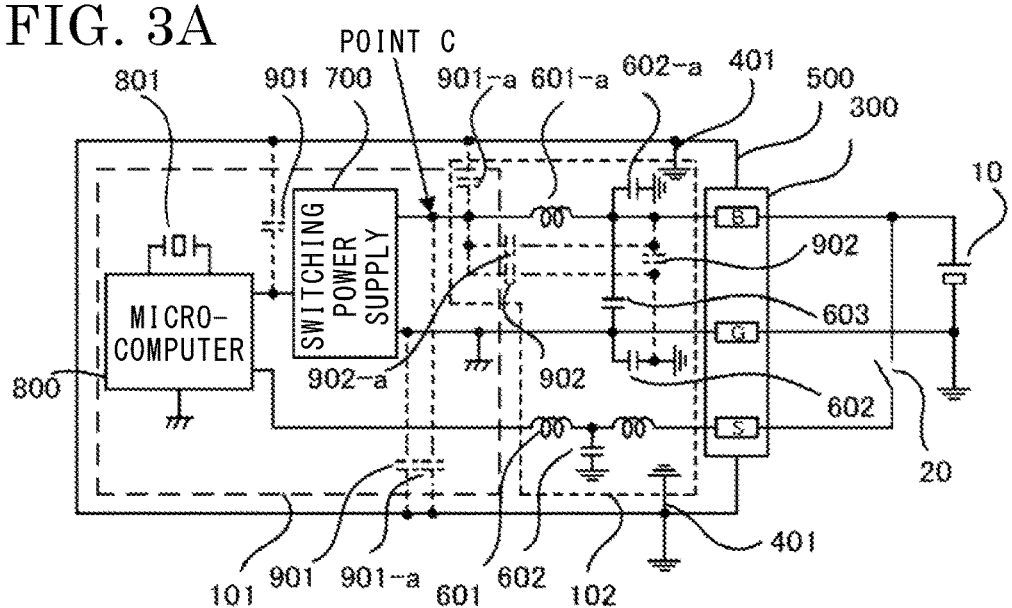
FIGS. 3A to 3C are circuit block diagrams illustrating embodiments 1 and 2.

FIG. 3A is a circuit block diagram of the electronic device. The main circuit pattern portion 101 has a switching power supply 700 and a microcomputer 800 mounted thereto. An oscillator 801 as a clock source is connected to the microcomputer 800. Meanwhile, the noise filter 600 that includes a coil 601 and a capacitor 602 is connected to the frame ground pattern portion 102. The main circuit pattern portion 101 and the frame ground pattern portion 102 partially overlap each other.

The switching power supply 700 has a several ten KHz to several hundred KHz clock source for operating the circuit. The clock source becomes a noise source, and high-frequency noise is superimposed into a power supply line, a ground line, and a peripheral pattern. Similarly, several MHz to several ten MHz of high-frequency noise is superimposed also into the oscillator 801 of the microcomputer 800. The high-frequency noise including harmonic components generally increases up to several hundred KHz to several hundred MHz (up to several GHz in some cases). If the noise leaks through the connector 300 to a harness, the noise may interfere with an external device. In an on-vehicle state, the noise mainly becomes interfering radio waves to a radio receiver.

Noise generated between the power supply and the ground is a normal mode noise, and noise generated between the circuit and the housing is a common mode noise.

It is generally known that the normal mode noise can be removed by a low pass filter that includes a coil 601-$a$ and a capacitor 603 in FIG. 3A, and the description thereof is omitted.

A capacitor (stray capacitance) 901 indicated by a broken line is a stray capacitance between the main circuit pattern portion 101 and the housing 500, and is not provided as a component. Similarly, a capacitor (stray capacitance) 902 is a stray capacitance between the main circuit pattern portion 101 and the frame ground pattern portion 102, and is not provided as a component. In a case where the stray capacitance is large, electrostatic coupling is dense. In a case where the stray capacitance is small, electrostatic coupling is sparse. In the circuit block diagram shown in FIG. 3A, as described above, the main circuit pattern portion 101 and the frame ground pattern portion 102 partially overlap each other, so that electrostatic coupling is dense.

Figure 4A:
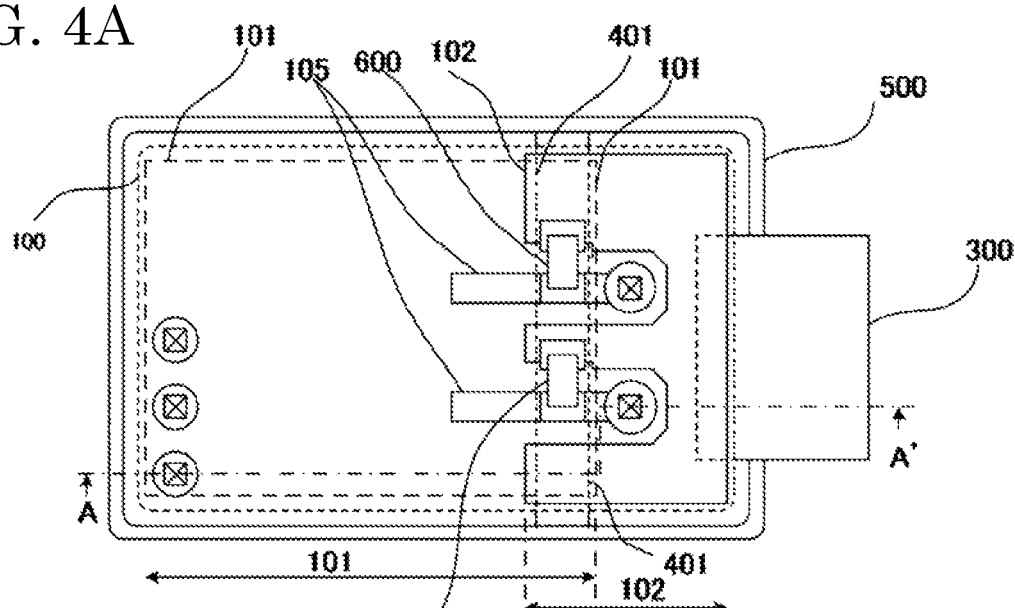
FIGS. 4A to 4C illustrate the entire configuration of the electronic device in the circuit block diagram shown in FIG. 3A.
Figure 4B:
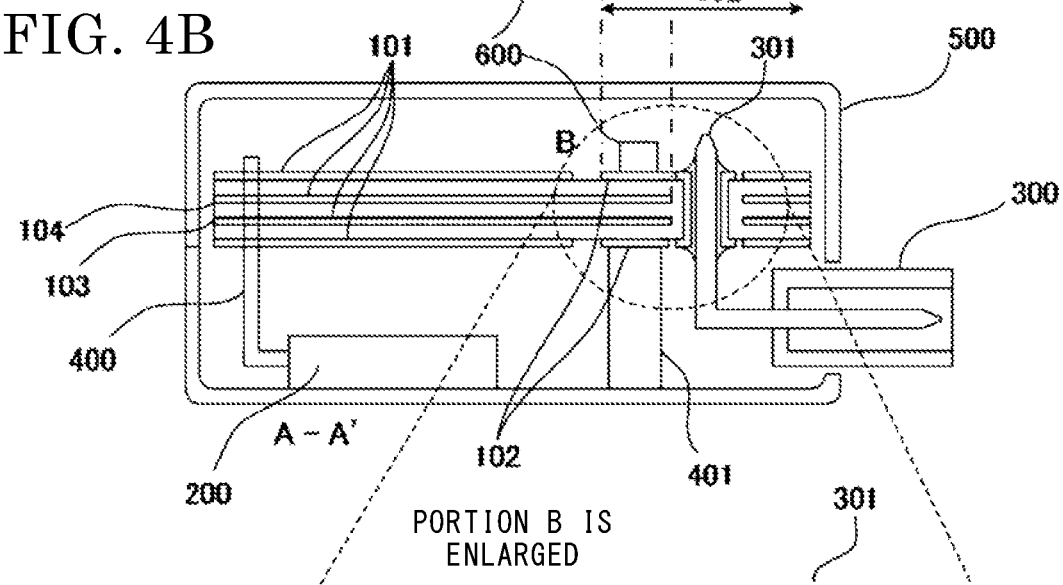
Figure 4C:
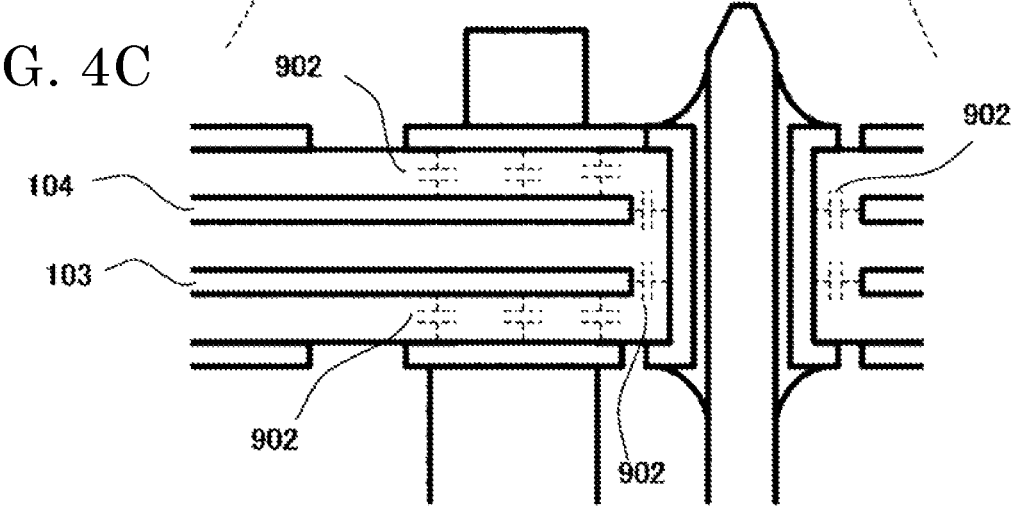

FIGS. 4A to 4C illustrates the entire configuration of the electronic device in the circuit block diagram shown in FIG. 3A, FIG. 4A is a plan view thereof, FIG. 4B is an A-A' cross-sectional view of the electronic device shown in FIG.

4A, and FIG. 4C is an enlarged cross-sectional view of a portion B indicated by a broken line in FIG. 4B. As shown in FIG. 4A and FIG. 4B, the main circuit pattern portion 101 and the frame ground pattern portion 102 partially overlap each other at inner layer patterns 103, 104. Therefore, even in a case where a point C in FIG. 3A is on the main circuit pattern portion 101 side of the inner layer patterns 103, 104, when the pattern that extends from the point C is wired to a portion that overlaps the frame ground pattern portion 102, electrostatic coupling to a pattern disposed above or below the inner layer patterns 103, 104 or the connector terminal 301 occurs through the stray capacitance 902 shown in FIG. 4C. Thus, noise is easily transmitted from the main circuit pattern portion 101 to the frame ground pattern portion 102. The noise transmitted to the frame ground pattern portion 102 may leak through the connector terminal 301 to the outside of the electronic device, to interfere with an external device.

A specific value of the stray capacitance indicated by the capacitor (stray capacitance) 902 in the case of the electrostatic coupling being dense is considered by using an example of a four layer FR4 printed board which is often used. In a case where a 10 mm square pattern on the inner layer opposes that on the surface layer, the stray capacitance (coupling capacitance) is about 20 pF since the relative permittivity is about 4.7, and a distance between the layers is about 0.21 mm. This indicates that the capacitance is enough for transmitting a high-frequency noise signal.

Figure 3B:
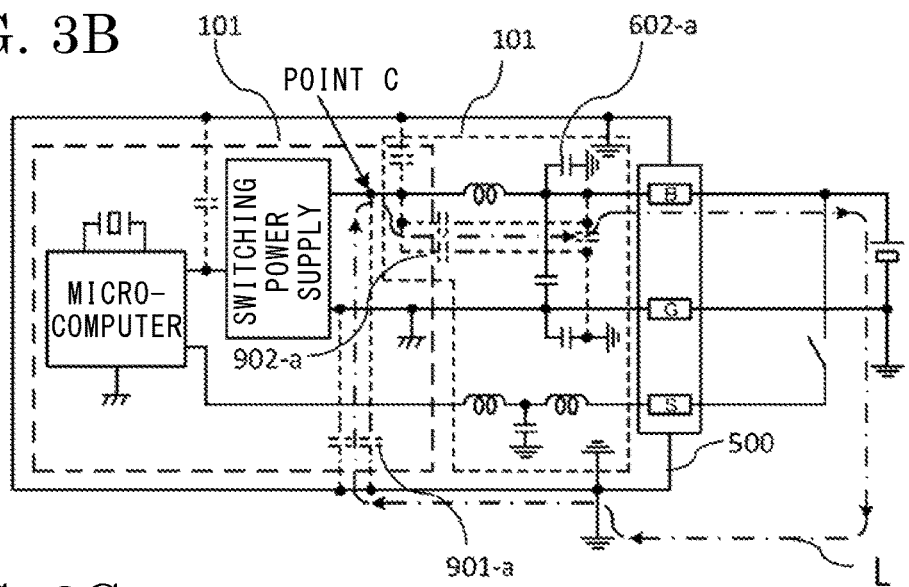

Next, a noise transmission route will be described with reference to the circuit block diagrams shown in FIG. 3A and FIG. 3B. In the drawings, in a case where a clock noise of the switching power supply is superimposed at the point C on the circuit, the noise is suppressed by the noise filter 600 (see FIGS. 1A and 1B) that includes the coil 601-a and the capacitor 602-a, and is not transmitted to a B line of the connector 300 (see FIG. 3A). However, as described with reference to FIG. 4C, in a case where the electrostatic coupling is dense, the stray capacitance 902-a occurs, so that the noise filter is bypassed and leakage from the B line to an external harness occurs, to generate a loop L (alternate long and short dash line in FIG. 3B) that returns to the point C that is a noise source via a battery 10, the housing 500, and a capacitor (stray capacitance) 901-a that is a stray capacitance. Strictly speaking, a route for returning a noise signal transmitted through the stray capacitance 902-a, via the capacitor 602-a, to the housing is also present, and, thus, the effect of the noise filter may be exerted. However, the coil 601-a does not function and the filtering performance is thus substantially degraded.

Meanwhile, in the configuration of the electronic device according to embodiment 1 of the present disclosure shown in FIGS. 1A and 1B, and FIGS. 2A and 2B, as described above, the patterns of the areas of the main circuit pattern portion 101 and the frame grand pattern portion 102 are completely separated from each other and wired without overlapping each other, and the electrostatic coupling is thus made sparse, in order to intentionally reduce the coupling capacitance between the main circuit pattern portion 101 and the frame ground pattern portion 102. Thus, the stray capacitance 902-a shown in FIG. 3A is absent or very small, and the route for bypassing the noise filter that includes the coil 601-a and the capacitor 602-a is disconnected (see FIG. 3C). The loop L of the noise transmission route described above is disconnected by the noise filter that includes the coil 601-a and the capacitor 602-a, so that the noise does not leak to the outside of the electronic device.

The example of the B line of the connector terminal has been described above. Similarly, the electrostatic coupling is made sparse for another line such as a G line and an S line, whereby leakage of noise can be prevented. The line connected from a G terminal shown in FIG. 3C into the housing 500 is grounded at the frame ground by the capacitor 602, and then wired to the main circuit pattern portion 101. This is for a case where the noise superimposed in the line is assumed to be relatively small. In a case where a large noise is superimposed, a coil similar to the coil 601-a of a B terminal is inserted, thereby enhancing the effect of the noise filter to effectively address the noise.

As described above, in a case where the coupling capacitance between the main circuit pattern portion 101 and the frame ground pattern portion 102 is made sparse, the noise filter effectively acts, and noise generated in the electronic device can be prevented from leaking to the outside of the device.

The example where noise is superimposed in the line connecting to the connector has been described. In a case where noise is not superimposed in the line itself which connects to the connector, the noise filter need not be inserted in the line since the electrostatic coupling between the main circuit pattern portion 101 and the frame ground pattern portion 102 is made sparse and influence of a line in which another noise is superimposed is not exerted.

Furthermore, in the present embodiment, the description has been made according to electrostatic coupling between the main circuit pattern portion 101 and the frame ground pattern portion 102 being dense or sparse. However, the electronic device can be configured by applying a similar idea to magnetic coupling.

In the present embodiment, the number of the substrates of the electronic circuit is one. However, also in a case where the number of the substrates is plural, the electronic device can be configured in a similar manner.

Embodiment 2

In embodiment 1, the example where the bypass route for noise is disconnected, that is, the coupling capacitance between the main circuit pattern portion 101 and the frame ground pattern portion 102 is made sparse, has been described. Another important measure for addressing noise is, for example, to enhance performance of the noise filter. The technique therefor will be described below.

Figure 3C:
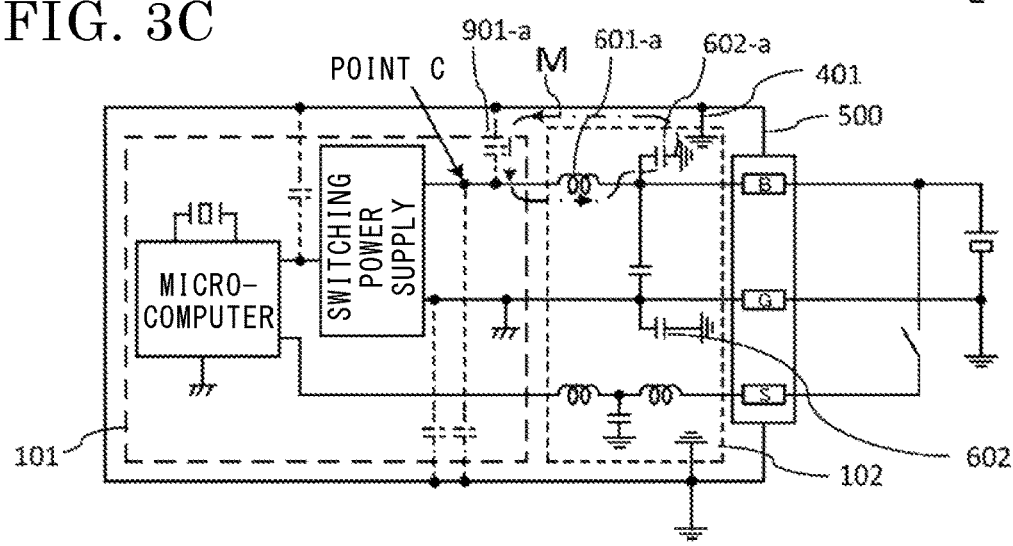

As described with reference to FIG. 3B, a noise transmission route in the case of the bypass route being disconnected is a loop that returns to a line of the point C via the line on which the point C is located, the coil 601-a, the capacitor 602-a, the frame ground pattern portion 102, the frame ground terminal 401, the housing 500, and the stray capacitance 901-a as indicated by a loop M as an alternate long and short dash line in FIG. 3C. At this time, an impedance at the capacitor 602-a as viewed from the right-side terminal of the coil 601-a needs to be sufficiently less than an impedance at the B terminal of the connector 300 in order to prevent noise from leaking to the connector B line. In other words, an impedance of the noise transmission route shown in FIG. 3C needs to be sufficiently less than an impedance of the noise transmission route shown in FIG. 3B (in a case where coupling capacitance is absent).

Furthermore, the configurations of an LC, an LCL, a CLC, and the like which include coils and capacitors are known as a noise filter. Each of them is selected and used according to a position at which the filter is inserted, or the required performance. In the case of a low pass filter, one of the terminals of each capacitor is grounded. It is well known that, at this time, the performance of the filter is degraded in a case where an inductance component that enters the capacitor in series increases due to wiring and a component lead. The coil may be any element that electrically has an inductance component. Therefore, ferrite beads may substitute for the coil.

In order to address this, the frame ground pattern portion 102 is widely disposed on the substrate, a chip capacitor is used, and the components are connected by the shortest wire, whereby lead inductance can be easily reduced. Furthermore, the frame ground pattern portion 102 and the housing 500 may be connected at a low impedance as described in embodiment 1.

An example where the frame ground and the housing 500 are connected by a substantially 0.6 mm square terminal is represented by the frame ground terminal 401 shown in FIGS. 1A and 1B. Increase of the length of the terminal leads to increase of an inductance, and the impedance thus increases entirely, so that degradation of the performance may be caused. The performance can be enhanced by making the terminal as short and as thick as possible and maximizing the number of the terminals.

Figure 5A:
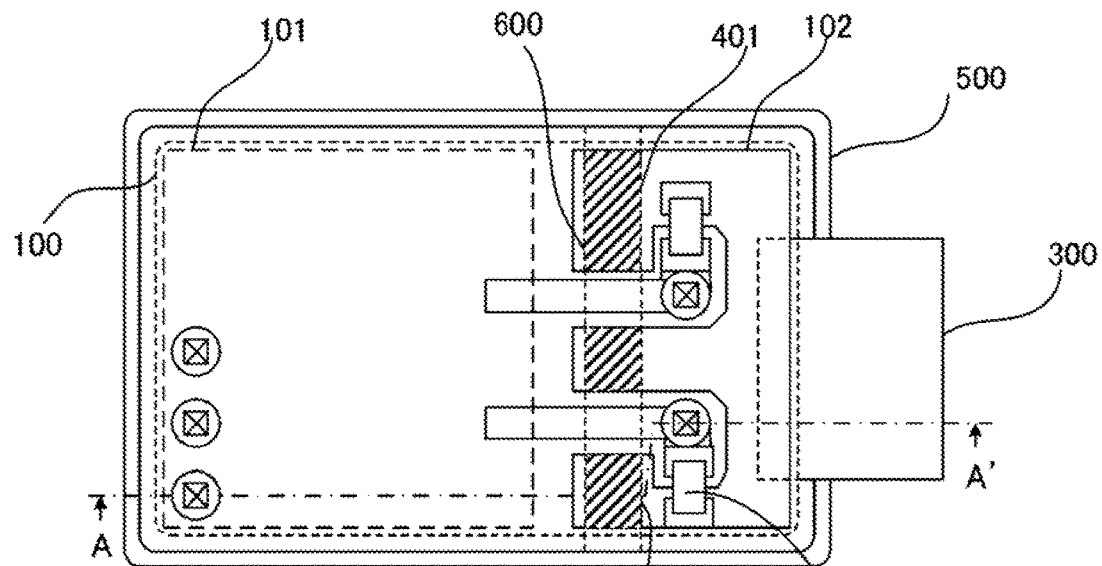
FIGS. 5A and 5B illustrate the entire configuration of an electronic device according to embodiment 2.
Figure 5B:
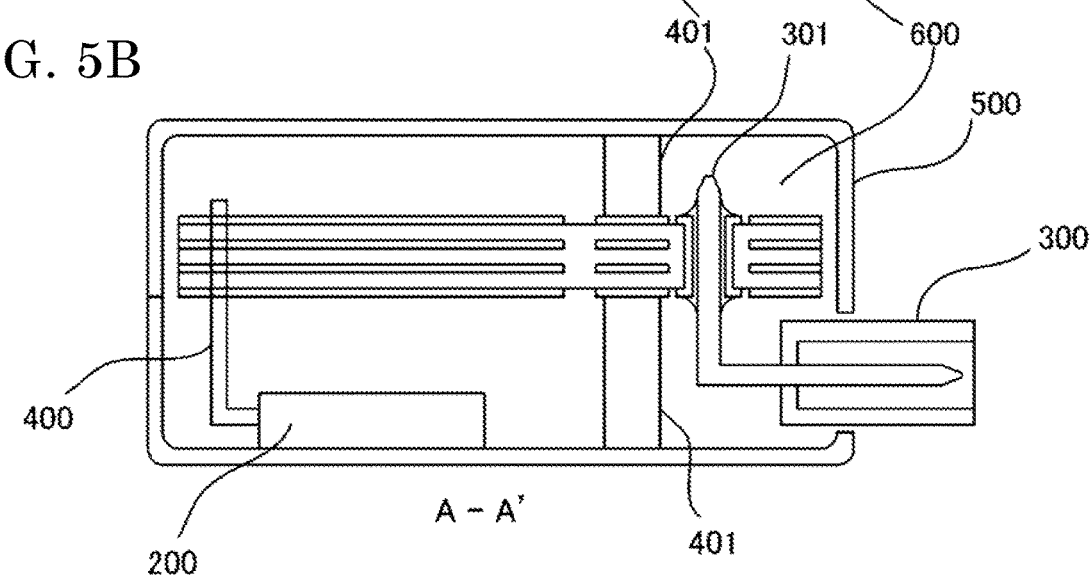

An example where the wall stands from each of the bottom surface and the top surface of the housing 500, and is electrically connected to the upper and lower faces of the frame ground pattern portion 102 of the substrate 100 is represented by the frame ground terminal 401 shown in FIGS. 5A and 5B. The diagonal line portion in the drawings represents the contact portion, on the upper face, at which the substrate 100 and the frame ground terminal 401 are in contact with each other. In such a configuration, the connection impedance between the housing 500 and the frame ground can be reduced, and the main circuit pattern portion 101 and the frame ground pattern portion 102 can be shielded by the housing 500.

Embodiment 3

In embodiments 1 and 2, the entirety of the housing is made of metal. An example where noise performance is not degraded even when only a part of the housing is made of metal, will be described with reference to FIGS. 6A and 6B.

Figure 6A:
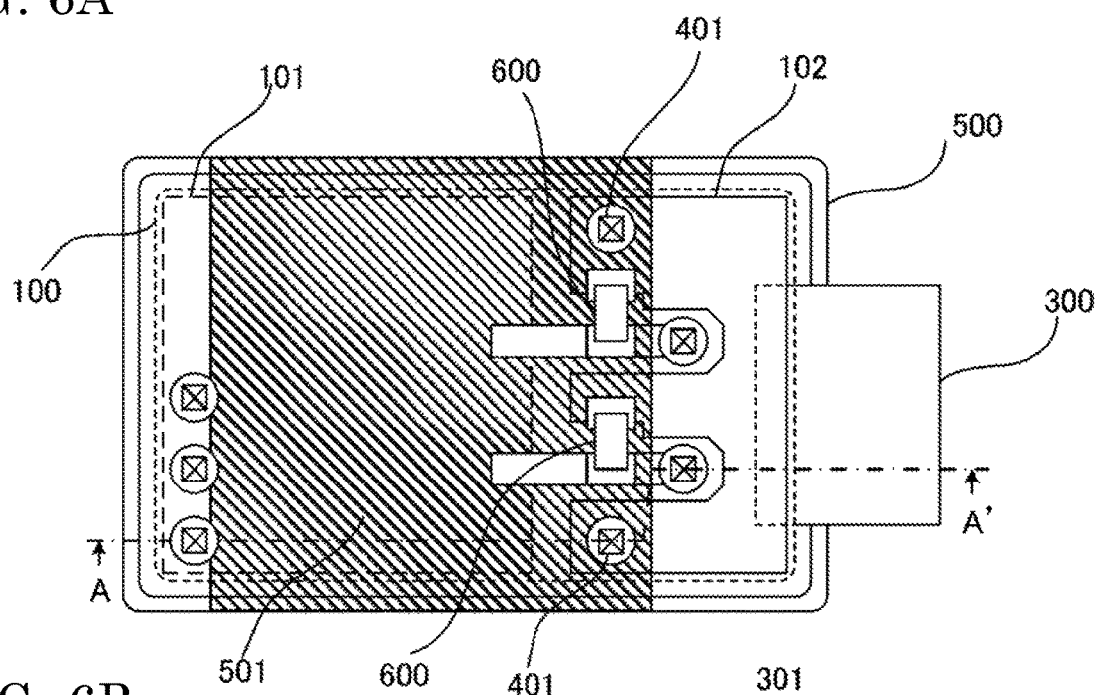
FIGS. 6A and 6B illustrate the entire configuration of an electronic device according to embodiment 3.
Figure 6B:
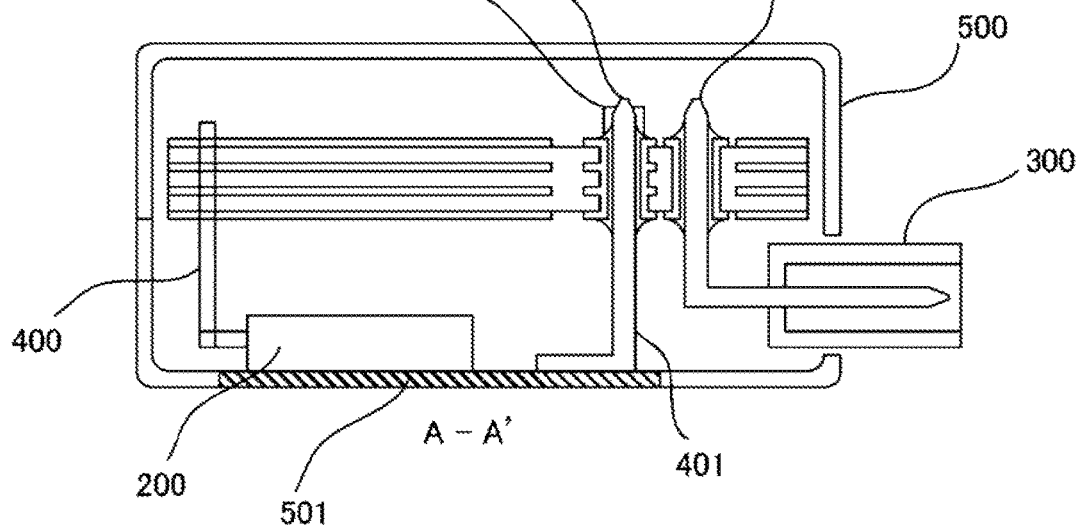

In FIGS. 6A and 6B, for example, in a case where a noise source is mainly the module 200, only a diagonal line portion 501 of the housing 500 may be allowed to be made of metal. Generation of stray capacitance between the module 200 and the diagonal line portion 501 is promoted, to generate a noise transmission route in the housing. The configuration in which the noise source and the noise transmission route are generated in the electronic device and impedance is made low has been described in embodiment 2. This configuration is effective in a case where the noise source can be specified. Description has been made by using the module 200 as an example. However, even in a case where the noise source is at another place or the number of the noise sources is plural, the designing can be similarly performed. A portion, of the housing, other than a metal portion (the diagonal line portion 501) can be made of resin or the like, whereby freedom of designing increases, and the weight and cost can be reduced.

Embodiment 4

Application of the electronic device described in each of embodiments 1 to 3 to an electric power steering apparatus will be described.

Figure 7:
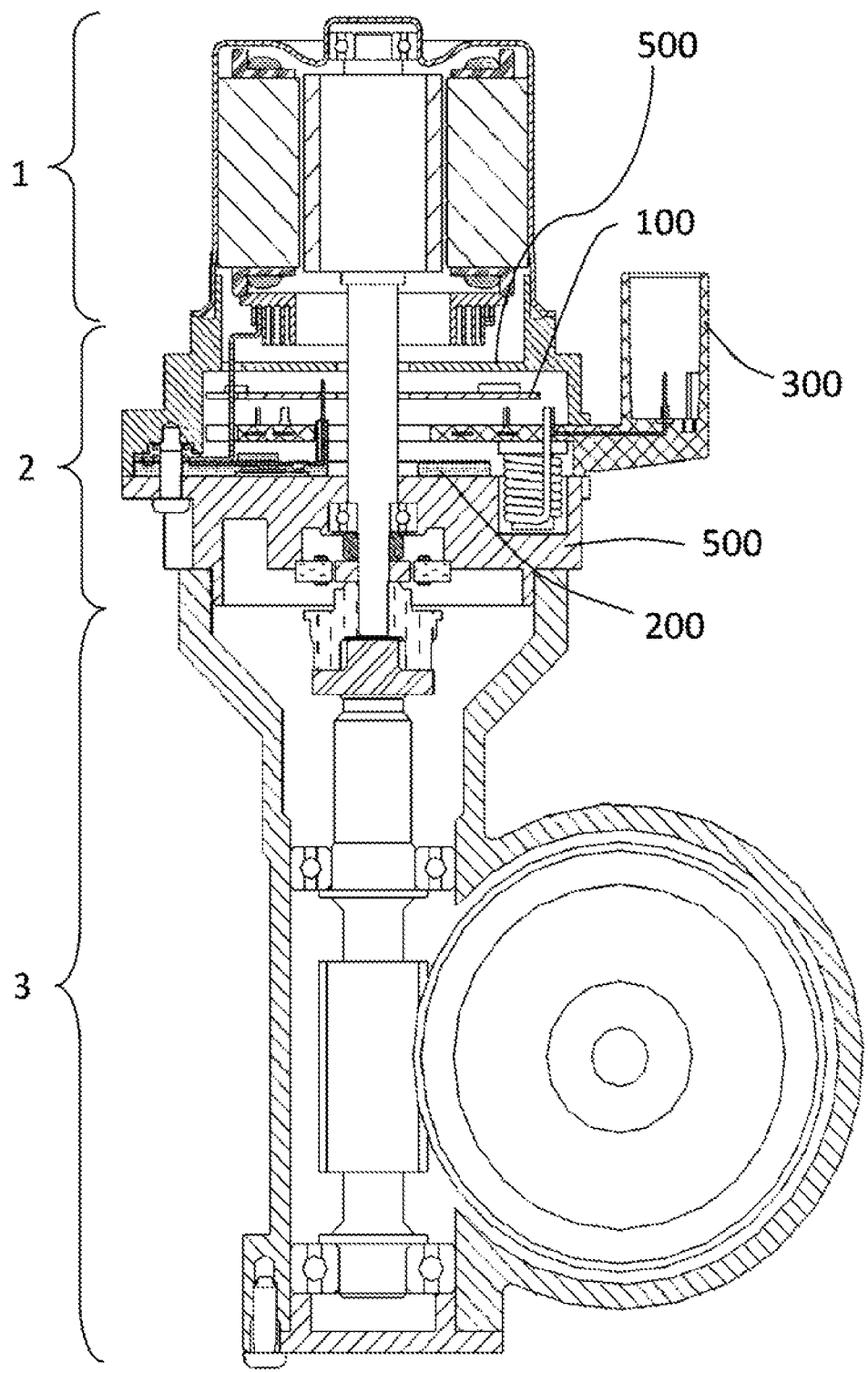
FIG. 7 illustrates a schematic configuration of an electric power steering apparatus according to embodiment 4.

FIG. 7 illustrates a schematic configuration of an electric power steering apparatus. A motor 1 and an ECU (electric control unit) 2 are coaxially disposed, and an output shape of the motor 1 is connected to a gear 3 through the ECU 2. Power is supplied from a battery (not shown) to the connector 300 of the ECU 2. A torque signal from a not-illustrated torque sensor mounted to a steering wheel shaft is inputted to the ECU 2, and the ECU 2 calculates an appropriate steering wheel assist amount according to the magnitude of the torque signal, to drive the motor 1 based on the calculation result. The output from the motor 1 is connected to the steering wheel shaft via the gear 3 to provide a proper assist.

Figure 8:
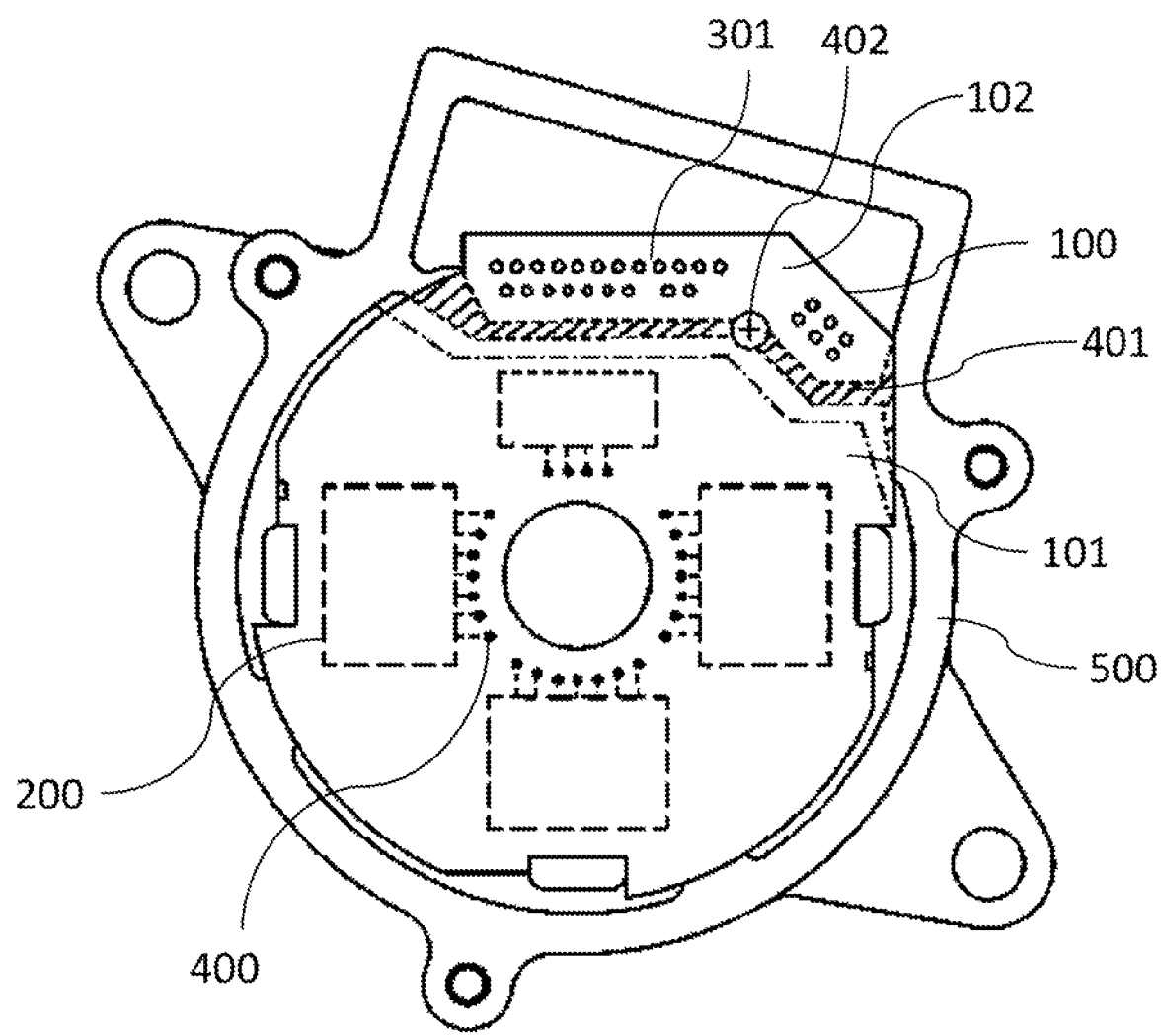
FIG. 8 illustrates a cross-section of the electric power steering apparatus as viewed from a motor 1 side at a position where a substrate 100 of an ECU 2 can be seen.

FIG. 8 illustrates a cross-section as viewed from the motor 1 side at a position where the substrate 100 of the ECU 2 can be seen. The module 200 where the substrate 100 is housed in the housing 500 produced by aluminum die casting is a power circuit for driving the motor 1 in the present embodiment. The module 200 and the substrate 100 are electrically connected by the wiring 400. Meanwhile, a plurality of the connector terminals 301 are disposed on the end face of the substrate 100 and soldered.

In the drawings, the diagonal line portion represents the frame ground terminal 401, and is a wall that stands from the case and is in electrical surface contact with the back face of the substrate. A screw 402 has a function to press the substrate 100 against the frame ground terminal 401 to assure the electrical connection.

A portion on the connector terminals 301 side from the frame ground terminal 401 indicated by the diagonal lines is the frame ground pattern portion 102. A portion on the lower side from a line indicated by an alternate long and short dash line is the main circuit pattern portion 101. The main circuit pattern portion 101 and the frame ground pattern portion 102 are designed such that wiring patterns including the inner layers do not overlap each other, and electrostatic coupling and magnetic coupling are made sparse as described in embodiments 1 to 3.

An appropriate noise filter 600 is disposed on a line connected from the main circuit pattern portion 101 to the connector terminals 301 in a boundary portion between the main circuit pattern portion 101 and the frame ground pattern portion 102, or on the frame ground pattern portion 102 side, which are not shown, thereby preventing noise from leaking to outside.

Thus, the main circuit pattern portion and the frame ground pattern portion on the substrate are designed without using specific components so as not to overlap each other, whereby an ECU having excellent noise performance can be provided.

As described above, electrostatic coupling between the main circuit pattern portion 101 and the frame ground pattern portion 102 is made sparse, whereby a bypass route for noise can be disconnected to reduce a common mode noise. The frame ground pattern portion 102 and the housing 500 made of metal are connected to each other at a low impedance, whereby the performance of the noise filter can be effectively exhibited to reduce a common mode noise. The metal portion of the housing 500 is disposed at a necessary place relative to the noise source of the electronic device, thereby enhancing cost performance.

A common mode noise that leaks from the electronic device to outside has been described above. In the configuration of the present disclosure, impedance to the housing 500 is clearly reduced in the electronic device as viewed from an external harness. Therefore, a noise coming from the outside flows via the connector 300 and the capacitor 602 to the housing 500 made of metal and does not flow into the main circuit. This means that external noise resistance of the electronic device has been improved.

Various electronic devices generally have specifications that are required based on an official standard for noise. For example, for on-vehicle devices, five classes of class 1 to class 5 are defined in CISPR 25 of the IEC in many cases. In a case where high performance is required for connection between a housing and a frame ground, configuration designing is restricted, and the size and the cost of the device tend to increase. The technique according to any of embodiments 1 to 3 can be adopted according to the required specifications to optimize the designing, thereby achieving an electronic device which has high performance and good cost performance.

The technique of the present disclosure is adopted for a controller of an on-vehicle electric power steering apparatus which has such characteristics and principle as to generate multiple noises based on the circuit mode and which typifies an inverter circuit for driving an inductance load such as a motor, as described in embodiment 4, thereby effectively improving EMC.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 100 substrate
101 main circuit pattern portion
102 frame ground pattern portion
200 module
300 connector
301 connector terminal
400 wiring
401 frame ground terminal
500 housing
600 noise filter

The invention claimed is:

1. An electronic device comprising:
a substrate having an electronic circuit formed therein;
a housing for housing the substrate; and
a connector disposed on the substrate and serving as an interface between outside and inside of the housing, wherein
the substrate has a main circuit pattern portion that forms a main circuit and a frame ground pattern portion that forms a frame ground,
the main circuit pattern portion and the frame ground pattern portion are disposed so as to not overlap each other on the substrate and in the substrate, and
a terminal of the connector is disposed in the frame ground pattern portion,
wherein a disposition of the main circuit pattern portion and the frame ground pattern portion so as to not overlap each other on the substrate and in the substrate is configured to suppress a noise transmission route involving the connector and the housing.

2. The electronic device according to claim 1, wherein
a noise filter is connected to a line connected from the main circuit to the connector,
the noise filter is disposed near a boundary between the main circuit pattern portion and the frame ground pattern portion or in the frame ground pattern portion, and
a ground of the noise filter is connected to the frame ground pattern portion.

3. The electronic device according to claim 1, wherein the frame ground pattern portion and the housing are each a member which has a connection portion formed in a planar shape, and are electrically connected to a bottom surface of the housing.

4. The electronic device according to claim 3, wherein the member which has the connection portion formed in the planar shape is a wall-like shielding member formed from the bottom surface to a top surface of the housing.

5. The electronic device according to claim 1, wherein
a module that is a noise source is housed outside the substrate in the housing, and
a portion, of the housing, which is in contact with the module is made of metal.

6. The electronic device according to claim 2, wherein the frame ground pattern portion and the housing are each a member which has a connection portion formed in a planar shape, and are electrically connected to a bottom surface of the housing.

7. The electronic device according to claim 2, wherein a module that is a noise source is housed outside the substrate in the housing, and
a portion, of the housing, which is in contact with the module is made of metal.

8. The electronic device according to claim 3, wherein a module that is a noise source is housed outside the substrate in the housing, and
a portion, of the housing, which is in contact with the module is made of metal.

9. The electronic device according to claim 4, wherein a module that is a noise source is housed outside the substrate in the housing, and
a portion, of the housing, which is in contact with the module is made of metal.

10. The electronic device according to claim 6, wherein
a module that is a noise source is housed outside the substrate in the housing, and
a portion, of the housing, which is in contact with the module is made of metal.

11. The electronic device of claim 1, wherein:
the connector is configured to couple to a wiring harness,
the wiring harness extends from the connector to a battery, and
the main circuit pattern portion and the frame ground pattern portion are disposed so as not to overlap each other thereby reducing a common-mode current in the harness by reducing an electromagnetic coupling between the main circuit pattern portion and the frame ground pattern portion.

12. The electronic device of claim 1, further comprising:
a microcomputer;
a switching power supply; and
an oscillator coupled to the microcomputer,
wherein a disposition of the main circuit pattern portion and the frame ground pattern portion so as to not overlap each other on the substrate is configured to reduce a common-mode current in the connector, and the reduction in common-mode current reduces an undesired radiation of electromagnetic energy related to a frequency of the oscillator to a second electronic device outside of the housing.

13. The electronic device of claim 1, wherein the substrate is a multi-layer printed board, and a surface layer pattern of the main circuit pattern portion and an inner layer pattern of the frame ground pattern portion are separated without overlapping each other.

14. An electric power steering apparatus comprising an electronic device, the electronic device comprising:
a substrate having an electronic circuit formed therein;
a housing for housing the substrate; and
a connector disposed on the substrate and serving as an interface between outside and inside of the housing, wherein
the substrate has a main circuit pattern portion that forms a main circuit and a frame ground pattern portion that forms a frame ground,
the main circuit pattern portion and the frame ground pattern portion are disposed so as not to overlap each other on the substrate and in the substrate, and
a terminal of the connector is disposed in the frame ground pattern portion,
wherein a disposition of the main circuit pattern portion and the frame ground pattern portion so as to not overlap each other on the substrate and in the substrate is configured to suppress a noise transmission route involving the connector and the housing.

15. The electric power steering apparatus of claim 14, wherein:
a noise filter is connected to a line connected from the main circuit to the connector,
the noise filter is disposed near a boundary between the main circuit pattern portion and the frame ground pattern portion or in the frame ground pattern portion, and
a ground of the noise filter is connected to the frame ground pattern portion.

16. The electric power steering apparatus of claim 14, wherein the frame ground pattern portion and the housing are each a member which has a connection portion formed in a planar shape, and are electrically connected to a bottom surface of the housing.

17. The electric power steering apparatus of claim 16, wherein the member which has the connection portion formed in the planar shape is a wall-like shielding member formed from the bottom surface to a top surface of the housing.

18. The electric power steering apparatus of claim 14, wherein:
a module that is a noise source is housed outside the substrate in the housing, and
a portion, of the housing, which is in contact with the module is made of metal.

19. The electric power steering apparatus of claim 15, wherein the frame ground pattern portion and the housing are each a member which has a connection portion formed in a planar shape, and are electrically connected to a bottom surface of the housing.

20. The electric power steering apparatus of claim 15, wherein:
a module that is a noise source is housed outside the substrate in the housing, and
a portion, of the housing, which is in contact with the module is made of metal.

21. The electric power steering of claim 16, wherein:
a module that is a noise source is housed outside the substrate in the housing, and
a portion, of the housing, which is in contact with the module is made of metal.

22. The electric power steering apparatus of claim 17, wherein:
a module that is a noise source is housed outside the substrate in the housing, and
a portion, of the housing, which is in contact with the module is made of metal.

23. The electric power steering apparatus of claim 19, wherein
a module that is a noise source is housed outside the substrate in the housing, and
a portion, of the housing, which is in contact with the module is made of metal.

* * * * *